(12) United States Patent
Sanders

(10) Patent No.: US 6,536,017 B1
(45) Date of Patent: Mar. 18, 2003

(54) SYSTEM AND METHOD FOR TRANSLATING A REPORT FILE OF ONE LOGIC DEVICE TO A CONSTRAINTS FILE OF ANOTHER LOGIC DEVICE

(75) Inventor: Lester S. Sanders, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 12 days.

(21) Appl. No.: 09/865,906

(22) Filed: May 24, 2001

(51) Int. Cl.[7] .............................................. G06F 17/50
(52) U.S. Cl. ............................................. 716/3; 716/10
(58) Field of Search ................................ 716/3, 10, 18; 371/22.1; 364/489, 490

(56) References Cited

U.S. PATENT DOCUMENTS 5,537,341 A * 7/1996 Rose et al. .................. 364/579
5,550,839 A * 8/1996 Buch et al. ................. 371/22.1
5,673,198 A * 9/1997 Lawman et al. ............ 364/489
5,815,405 A * 9/1998 Baxter ........................ 364/489
6,408,428 B1 * 7/2002 Schlansker et al. ........... 716/17

OTHER PUBLICATIONS

Mason et al. (U.S. patent application Publication US 2001/0047509 A1).*

* cited by examiner

Primary Examiner—David Nelms
Assistant Examiner—Thinh T. Nguyen
(74) Attorney, Agent, or Firm—Peter Kragusljac; Calfee, Halter & Griswold; Lois D. Cartier

(57) ABSTRACT

A system and method for translating a report file to a constraints file is provided. A circuit design is initially generated to be implemented on a logic device and a report file corresponding to the logic device is created. To transfer the circuit design to a different logic device, a constraints file generator analyzes the report file to determine characteristics of the logic device. A compatibility logic identifies a compatible device to the logic device based on the characteristics. A constraints file is then generated in accordance with the compatible logic device such that the circuit design can be re-targeted to the compatible device.

23 Claims, 6 Drawing Sheets

Figure 4

CHIP "count16" ASSIGNED TO AN EPM7064AETC100-4

| | |
|---|---|
| N.C. | : 1 |
| N.C. | : 2 |
| VCCIO | : 3 |
| TDI | : 4 |
| N.C. | : 5 |
| din5 | : 6 |
| GND* | : 32 |
| GND* | : 33 |
| VCCIO | : 34 |
| GND* | : 35 |
| din14 | : 36 |
| GND* | : 37 |
| GND | : 38 |
| VCCINT | : 39 |
| count12 | : 40 |
| count14 | : 41 |
| count6 | : 42 |
| GND | : 43 |
| count5 | : 44 |
| count10 | : 45 |
| count9 | : 46 |
| count13 | : 47 |
| count15 | : 48 |
| N.C. | : 49 |
| N.C. | : 50 |
| VCCIO | : 51 |
| count8 | : 52 |
| N.C. | : 53 |
| VCCINT | : 91 |
| din13 | : 92 |
| din12 | : 93 |
| din11 | : 94 |
| GND | : 95 |
| din10 | : 96 |
| din9 | : 97 |
| din2 | : 98 |
| din3 | : 99 |
| din4 | : 100 |

Figure 5

// Xilinx, Inc.
PINLOCK_BEGIN
Mon Mar 12 09:26:23 2001
NET din5 LOC=P6;
NET din6 LOC=P8;
NET din7 LOC=P9;
NET din1 LOC=P10;
NET din0 LOC=P12;
NET ld LOC=P13;
NET rst LOC=P14;
NET din8 LOC=P25;
NET din15 LOC=P31;
NET din14 LOC=P36;
NET count9 LOC=P46;
NET count13 LOC=P47;
NET count15 LOC=P48;
NET count8 LOC=P52;
NET count4 LOC=P54;
NET count3 LOC=P56;
NET count7 LOC=P57;
NET count2 LOC=P58;
NET count11 LOC=P60;
NET count1 LOC=P61;
NET count0 LOC=P63;
NET clk LOC=P87;
NET din13 LOC=P92;
NET din9 LOC=P97;
NET din2 LOC=P98;
NET din3 LOC=P99;
NET din4 LOC=P100;
PINLOCK_END

Figure 6

Altera device is EPM7064AETC100
Altera product is 7064
Altera family is 7000 AE
Altera package is TC100
Altera speed grade is -4

Xilinx offers the XCR3064XL and XCR3128XL in the 100 pin
thin quad flatpack package.

Converting count16.pin file to count16.ucf file.

Note: If there are signal names with leading/trailing underscores, tilde characters,
the signal name may be changed slightly. Dedicated pins (JTAG, power and ground
signals, including VCCINT and VCCIO) are not translated. RESERVED pins
in the Altera pin file are translated to PROHIBIT in the ucf file.

SYSTEM AND METHOD FOR TRANSLATING A REPORT FILE OF ONE LOGIC DEVICE TO A CONSTRAINTS FILE OF ANOTHER LOGIC DEVICE

FIELD OF THE INVENTION

The invention relates generally to design systems for programmable logic devices. It finds particular application to a system and method for translating a report file of one logic device to a constraints file of another logic device so that a circuit design can be transferred from one logic device to the other logic device.

BACKGROUND OF THE INVENTION

Different programmable logic vendors, in some cases, manufacture and sell pinout compatible devices. These are conventionally known as second sourced components. As an example, different vendors have certain device families that are generally pinout compatible between each other. Furthermore, there may be multiple families within a device family. For example, Altera offers 7000, 7000A, 7000AE, and 7000B series complex programmable logic devices (CPLD). Within each family, a range of devices, usually a subset of 32, 64, 128, 256, and 512 macrocell products, and a variety of packages is offered. Xilinx has a similar set of evolving families. Each vendor typically provides multiple products in the same package, usually with the same pinout. For example, several vendors provide both the 64 and 128 macrocell device in a 100 pin TQ package. These two devices have the same power and ground locations, so either device is a candidate for re-targeting to a second source.

Not all devices in each vendor's device family are second sourced, and in some cases there may be minor differences in the pinout of the devices. While some devices are pinout compatible, they are typically not functionally identical. Even though there are functional differences, approximately 90% of circuit designs can be implemented in any of the vendor's devices. Thus, they are generally considered second source components. However, since the devices are not functionally identical, each vendor supplies custom programmable logic design software to produce design files needed to program and use a selected logic device.

A designer uses the design software by describing a design in a supported format such as circuit schematics, VHDL, or Verilog. VHDL and Verilog are hardware description languages known in the art. VHDL stands for VHSIC Hardware Description Language, where VHSIC stands for very high speed integrated circuit. There are several other standard hardware description languages currently used in the art. Optionally, the designer can provide the design software with a constraints file which describes such information as the desired device and package to target, desired pinout locations for signals, and other hardware characteristics. The design software produces, in addition to programming files for programming the logic device, report files that contain device, product, package, pinout, and speed information that result from processing the circuit design. The report file and constraints file are not interchangeable by the design software of different vendors.

In prior systems, it has been very difficult for a designer to transfer a circuit design of one logic device to be used for another logic device of a different vendor. Manual analysis of device and package compatibility information was required and based on this information, the designer would manually edit the constraints file or device selection to re-target the circuit design to a different device. This information would be obtained by the designer by researching data books from each vendor to determine compatible devices and pin layouts. This can require considerable effort and is error prone. The designer would manually translate pin information to a constraints file but designs can have hundreds of pin locations. A further problem is that vendors have different signal name requirements that also need to be converted before a circuit design can be implemented onto a different logic device. The prior approach is time consuming and subject to error.

The present invention provides a method and system for transferring a circuit design from one logic device to another logic device that cures the above problems and others.

SUMMARY OF THE INVENTION

According to one embodiment of the present invention, a system for re-targeting a circuit design that was generated for a first programmable logic device to a second programmable logic device is provided. A compatibility logic identifies a second programmable logic device that is compatible with the first programmable logic device. A constraints file generator receives a report file configured for the first programmable logic device and translates the report file to a constraints file configured for the second programmable logic device such that the circuit design can be re-targeted on the second programmable logic device.

In accordance with a more limited aspect of the present invention, the system includes compatibility data that identifies compatibility characteristics between a plurality of programmable logic devices.

According to another embodiment of the present invention, a process of translating a circuit design targeted for a first programmable logic device to be targeted to a second programmable logic device is provided. A report file is received that identifies characteristics of the circuit design relating to the first programmable logic device. A second programmable logic device is then identified that is compatible with the first programmable device based on the characteristics from the report file. A constraints file is generated from the report file including pin constraints for the second programmable logic device that allows the circuit design to be targeted to the second programmable logic device.

In accordance with a more limited aspect of the present invention, the process includes providing device recommendations based on the compatibility of the second programmable logic device.

One advantage of the present invention is that the system can automatically generate a constraints file that allows a circuit design made for one logic device to be transferred to a compatible logic device.

Another advantage of the present invention is that the system can automatically identify compatible logic devices based on a report file.

Still further advantages of the present invention will become apparent to those of ordinary skill in the art upon reading and understanding the following detailed description of the preferred embodiments.

BRIEF DESCRIPTION OF THE DRAWINGS

In the accompanying drawings which are incorporated in and constitute a part of the specification, embodiments of the invention are illustrated, which, together with a general description of the invention given above, and the detailed description given below, serve to example the principles of this invention.

FIG. 4 is an exemplary report file;

FIG. 5 is an exemplary constraints file generated from the report file of FIG. 4; and FIG. 6 is an exemplary message to the user regarding device characteristics found from the report file of FIG. 4 and compatibility recommendations.

DETAILED DESCRIPTION OF ILLUSTRATED EMBODIMENT

Figure 1:
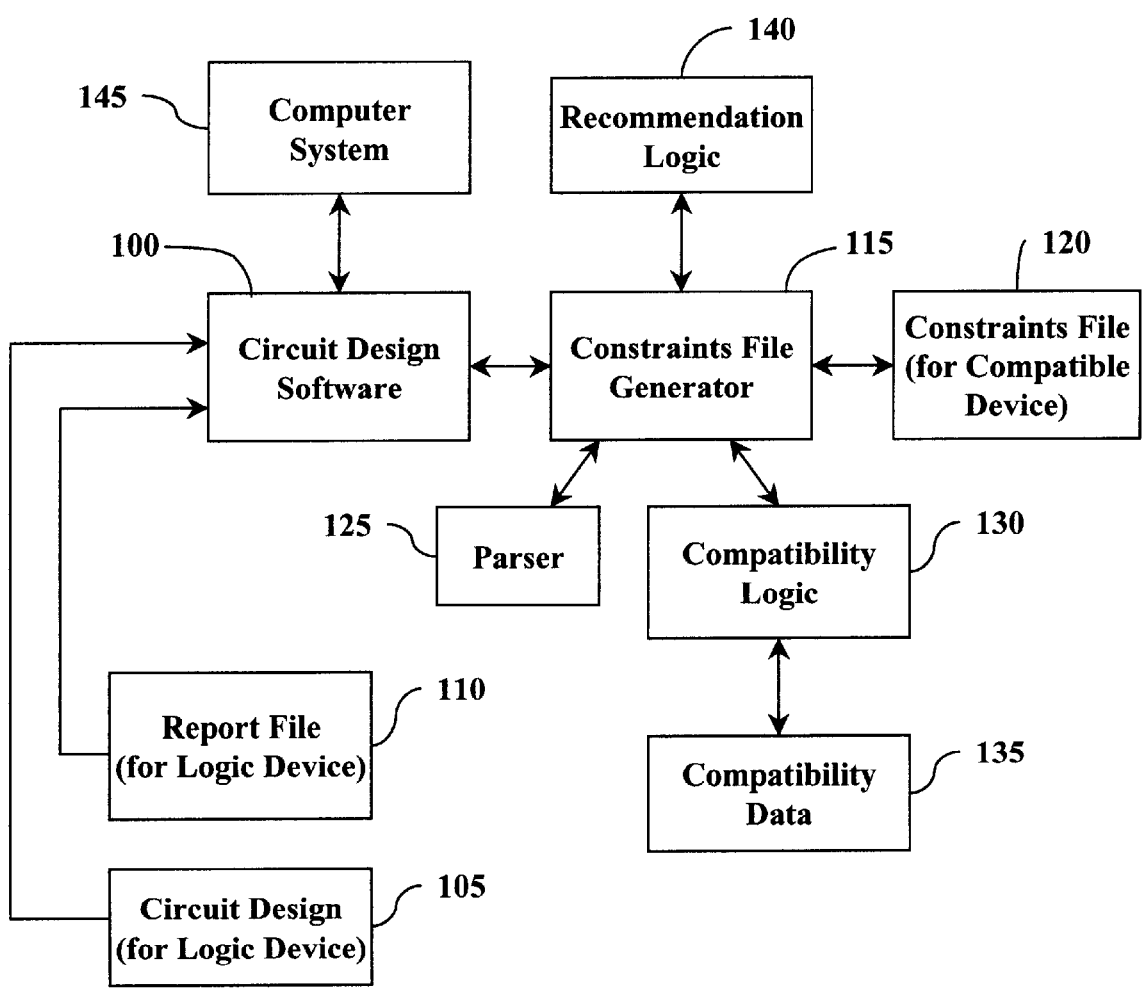
FIG. 1 is an exemplary overall system diagram of a constraints file generator in accordance with the present invention.

The following includes definitions of exemplary terms used throughout the disclosure. Both singular and plural forms of all terms fall within each meaning:

"Logic device", as used herein, is used generically including but is not limited to programmable logic devices (PLD), complex programmable logic devices (CPLD), field programmable gate arrays (FPGA), gate arrays, standard cell based ASIC (application specific integrated circuit), custom designed integrate circuit products, memories, and other devices and chips that can be programmed or designed to have logic. Logic device and programmable logic device are used interchangeably.

Regarding "logic device", characteristics, "device", as used herein, identifies a logic device by a device name typically reflecting the number of macrocells the device contains. For example, device 3032 or 7032 reflects a device having 32 macrocells. "Family" identifies different generations of a device from a particular vendor. "Package" is a component that houses an integrated circuit or other logic device on a printed circuit board and protects it from environmental hazards. "Product" is a generic term encompassing what a particular vendor supplies.

"Software", as used herein, includes but is not limited to one or more computer executable instructions, routines, algorithms, functions, modules or programs including separate applications or from dynamically linked libraries for performing functions as described herein. Software may also be implemented in various forms such as a servlet, applet, stand-alone, plug-in or other type of application.

"Logic", as used herein, includes but is not limited to hardware, software and/or combinations of both to perform one or more functions.

"Network", as used herein, includes but is not limited to the internet, intranets, Wide Area Networks (WANs), Local Area Networks (LANs), and transducer links such as those using Modulator-Demodulators (modems). "Internet", as used herein, includes a wide area data communications network, typically accessible by any user having appropriate software. "Intranet", as used herein, includes a data communications network similar to an internet but typically having access restricted to a specific group of individuals, organizations, or computers.

The present invention is a system and method for automatically and directly translating a programmable logic device (PLD) report file containing, for example, device, package, and pin information into a second PLD vendor's pin constraints file. The system enables chip designers to re-target a design to different products without manually creating a new constraints file with pin locations. It also provides the designer with device and package compatibility information between devices and vendors so the designer is not required to research data books. With the present system, a designer can facilitate price competition between vendors. Designs can also be re-targeted based on device availability from the industry and/or the obsolescence of device families by programmable logic device vendors. Other reasons for re-targeting may include reducing power, increasing speed, and others as will be appreciated by those of ordinary skill in the art.

Illustrated in FIG. 1 is an exemplary overall system diagram in accordance with the present invention. Circuit design software 100 is a software application that optimizes circuit/chip designs inputted to the system and performs place and route operations as is known in the art. The circuit design software generates a programming file that is used to program a targeted programmable logic device in accordance with the circuit design and also generates a report file that includes characteristics of the targeted programmable logic device. For example, the report file includes information about the targeted device, product, package, signal names, locations of signals and pins. Of course, other information can be contained in a report file as desired based on device and/or system requirements. The report file may also include more than one file.

With further reference to FIG. 1, a circuit design 105 and a report file 110 are previously generated to be targeted for a first logic device of a first vendor "A". The circuit design is typically created using known design tools such as schematics, a hardware description language or a combination of both. The report file 110 is generated by circuit design software that processes and optimizes the circuit design 105 specific to vendor A products and requirements. Subsequently, the circuit design 105 is desired to be transferred and targeted to a device supplied by a different vendor "B". In that regard, a constraints file generator 115 translates the report file 110 corresponding to the first programmable logic device and generates a constraints file 120 that allows the circuit design software 100 used by vendor B to program the circuit design 105 onto a second logic device of vendor B in accordance with vendor B's products and requirements.

With further reference to FIG. 1, the constraints file generator 115 includes a parser 125 that parses and analyzes the report file 110 to identify the characteristics of the first logic device. Based on those characteristics, a compatibility logic 130 determines and identifies one or more logic devices that are compatible (fully or partially) with the first logic device. This is performed by searching and matching the characteristics from the report file 110 to compatibility data 135 to determine other compatible devices.

Based on the results of the compatibility search, a recommendation logic 140 generates and displays information to a user regarding the compatibility found. Recommendations may include indicating to the user the degree of compatibility found between devices, particular areas that were not compatible, package compatibility results, warnings if no compatibility was found and other information regarding transferring the circuit design 105 to a different vendor's logic device. Once a compatible device is identified, the constraints file 120 is generated which includes pin location information for the compatible logic device such that the circuit design 105 can be programmed onto the compatible logic device. If only partial compatibility is determined, the constraints file generator 115 generates the constraints file 120 to the extent possible and allows the user to manually edit the constraints file, if necessary.

The circuit design software 100, the constraints file generator 115 and its components are both embodied as software stored on a computer readable medium and includes instructions executable by a computer system 140. For example, the constraints file generator can be implemented in any known programming language such as PERL, C++, or others. The computer system 145 generally may take many forms, from a configuration including a variety of processing units, networked together to function as a integral entity, to a single computer, e.g., a personal computer, operational in a stand-alone environment. The computer system 140 may also be a network server servicing remote users, such as through the Internet. The present invention can be embodied in any of these computer system configurations. As known in the art, computer systems may include a variety of components and devices such as a processor, memory, data storage, data communications buses, a network communications device, compilers, library files, etc.

Figure 2:
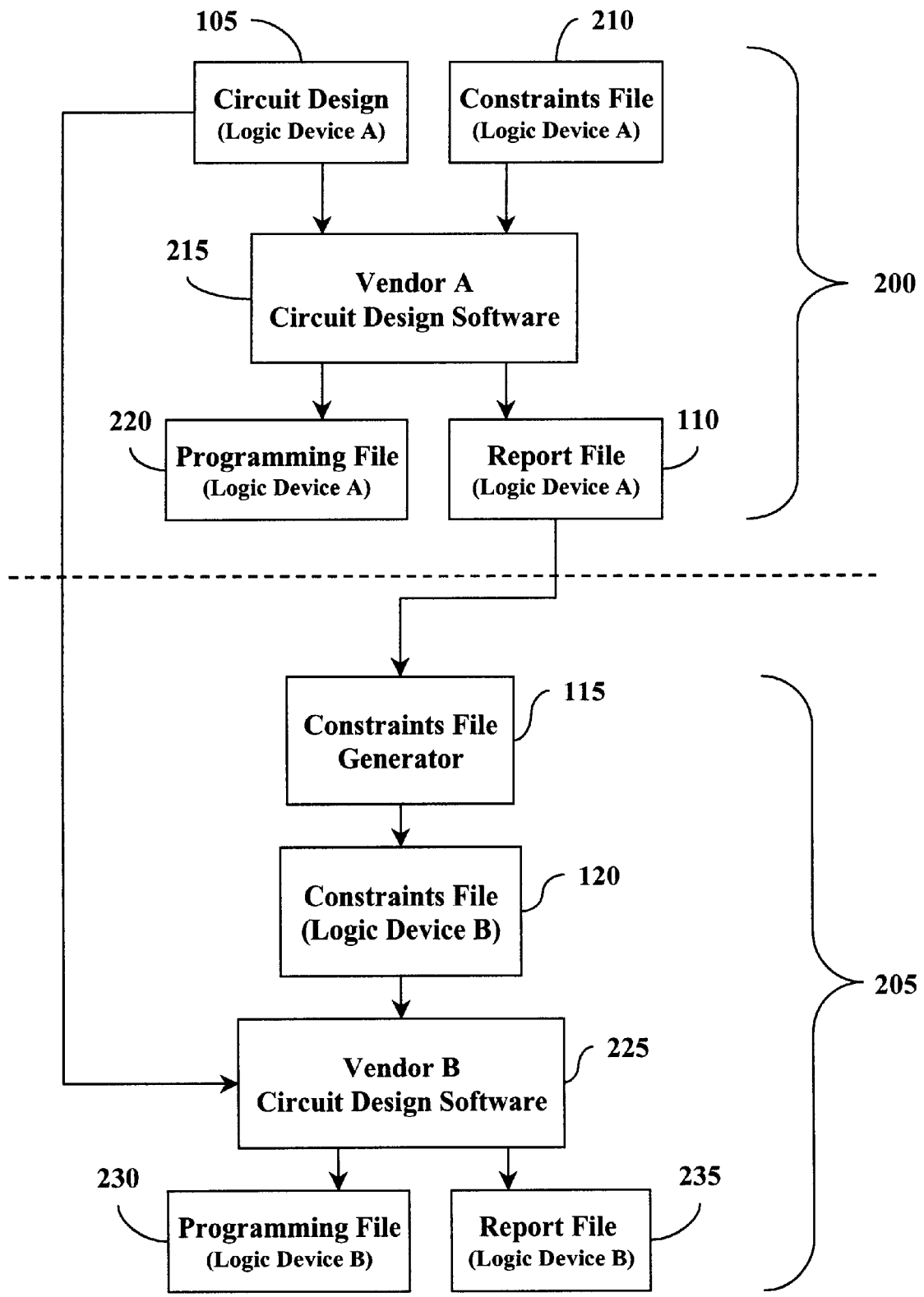
FIG. 2 is an exemplary component diagram of transferring a circuit design from one logic chip to another in accordance with the present invention.

Illustrated in FIG. 2 is an exemplary diagram of components and flow involved for obtaining the initial circuit design 105 and report file 110 generated for a logic device (e.g. logic device A) and transferring the circuit design 105 to a different logic device (e.g. logic device B). For exemplary purposes, presume that the circuit design 105 is initially created for logic device A supplied by a first vendor A. The circuit design 105 is subsequently desired to be implemented on a device supplied by a second vendor B (logic device B). The diagram of FIG. 2 is divided into two portions separated by the dashed line, namely, a vendor A portion designated by reference 200 and a vendor B portion designated by reference 205. The vendor A portion occurs outside of the present system, while the components of the vendor B portion are embodied in the present system.

With further reference to FIG. 2 and the vendor A portion 200, when a user/designer begins creating a circuit design for a first logic device A, the user will determine signal to pin correspondences in the logic device. In other words, the user identifies certain signals to be on certain pins. This may occur based on the user's selections or from recommendations from the device's vendor, or both. To designate this to a circuit design system 215, a constraints file 210 is created by the user identifying the hardware constraints for the logic device A so that the circuit design 105 is implemented according to those constraints.

The circuit design 105 and constraints file 210 are inputted to vendor A design software 215 which optimizes the circuit design and performs place and route operations as known in the art. For example, the circuit design 105 may start out with a large amount of gates defined by logic equations. The optimization determines a minimum and optimal set of logic equations representing the same functions. If a certain design includes 2000 gates, the optimization may reduce it down to 500 gates, for example. Once the gates are in an internal logic format, the place and route operation puts those gates on the logic device or in the case of an ASIC, the gates are put on an integrated circuit. This operation is defined by a programming file 220. The design software also generates a report file 110 that lists characteristics of the targeted logic device A which includes signal names and locations of signals and pins. The characteristics also include identification characteristics of the targeted device such as the device name, product name, package type, pin-outs, and speed information that result from processing the design 105.

At some subsequent time, the user may wish to use the same circuit design 105 but on a device from a different vendor. To transfer the original design 105 to a different logic device supplied by vendor B, the report file 110 (originally created for logic device A) is inputted to the constraints file generator 115 of the present system. The constraints file generator translates the report file 110 into a constraints file 120 for a logic device B supplied by vendor B that is determined to be compatible to logic device A. The constraints file 120 and the original circuit design 105 are then inputted to vendor B design software 225 which performs similar functions as vendor A design software 215 but which uses different formats and syntax. With the circuit design 105 and constraints file 120 as input, the vendor B design software 225 generates a corresponding programming file 230 and a report file 235 that are used to implement the circuit design 105 onto the compatible logic device B from vendor B.

Figure 3:
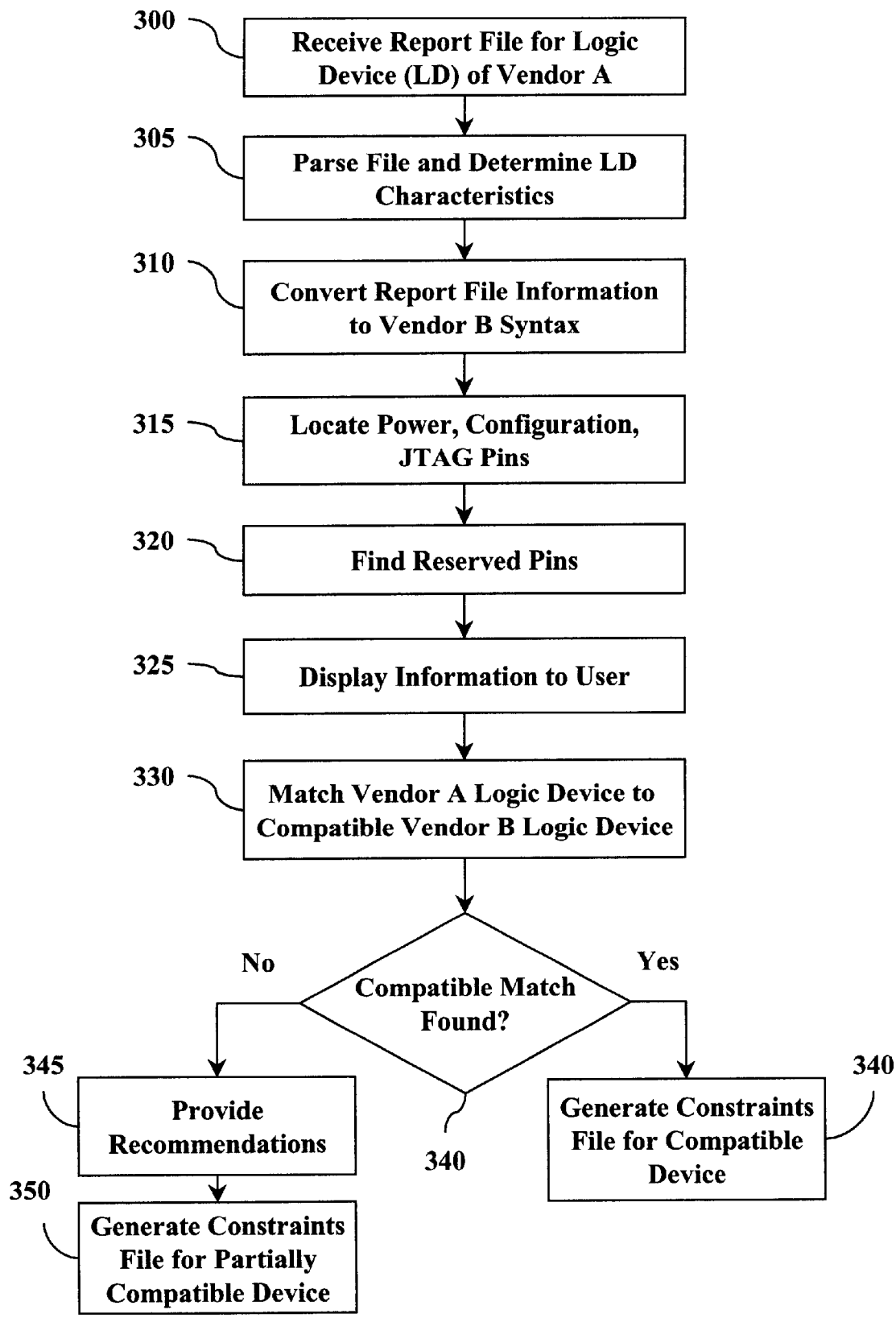
FIG. 3 is an exemplary methodology of generating a constraints file in accordance with the present invention.

Illustrated in FIG. 3 is an exemplary computer implemented methodology for generating a constraints file in accordance with the present invention. The blocks shown represent functions, actions or events performed therein. It will be appreciated that computer software applications involve dynamic and flexible processes and logic such that the illustrated blocks can be performed in other sequences different than the one shown. It will also be appreciated by one of ordinary skill in the art that the software of the present invention may be implemented using various programming approaches such as procedural, object oriented or artificial intelligence techniques.

With reference to FIG. 3, the report file 110 is received corresponding to a circuit design targeted to a first logic device (block 300). The report file is parsed and analyzed to determine characteristic information relating to the first logic device. As described above, these characteristics include identifiers of the device, product family, package, signal names, and pin locations as well as other information. Since the design software used by vendor B is typically different and requires different file formats and program syntax, information from the report file, such as signal names, are converted to comply with the format and syntax of the software and system used by vendor B (block 310). This includes, for example removing illegal characters and/ or converting other types of non-compliant text. In general, the information from the report file is put into a format compliant with vendor B requirements.

Other characteristics may also be determined from the report file including the location of power, configuration, and JTAG pins (block 315). For example, even when a device is regarded as a pin-compatible device, it may not be 100 percent pin-compatible. There may be some exceptions in compatibility which the system tries to identify between the logic device A and devices from vendor B or other vendors. For example, a device may have the ability to set the power in different states so that a normally 3.3 volt device can handle 2.5 volt inputs and outputs. These types of characteristics are identified so that they can be either removed from the constraints file and/or identified to the user as a recommendation. In general, the recommendations provided by the recommendation logic 140 intelligently advise the user of the differences between the logic device A and potential compatible devices.

Analyzing the report file includes searching for other types of characteristics such as reserved pins (block 320). When generating the original circuit design, the user may reserve certain pins instead of applying a signal to them. If reserved pins exist, the constraints file for the compatible device will also define corresponding reserved pins to maintain a compatible design.

After the report file is read and analyzed, the identified device characteristics are displayed to the user (block 325).

The information identifies what was found relating to the logic device A, for example, device name, product, family, package, speed etc. The user can then review the characteristic information to determine that it is correct or make corrections as necessary with the characteristic information, the system (using the compatibility logic 130) identifies one or more logic devices that are compatible with the logic device A (block 330). This includes matching the characteristics to the compatibility data 135.

The compatibility data 135 is a pre-generated data compiled from vendor information relating to their products, devices, specifications and other data. From this information, compatible devices between different vendors and even the same vendor are determined and matched to each other. Also, partial compatibility between devices is identified. The compatibility table is built as a database, table, or other form where by inputting one or more device characteristics as a criteria, one or more candidate compatible devices are matched and identified. The data 135 is accessed by, for example, an index, a hash function, or other searching techniques as is known in the art.

If a compatible match is found (block 335), a constraints file is generated (block 340) that has hardware constraints for the compatible logic device B. This includes pin locations and reserved pin locations if any. An exemplary constraints file is a user constraints file (UCF) used by Xilinx design software, for example, Foundation Integrated Synthesis Environment also known as Foundation iSE.

If there is a partial compatibility match, the system provides device recommendations to the user regarding the differences between the devices (block 345). A preliminary constraint file is then generated to the extent possible based on the degree of compatibility (block 350). The user can then edit or modify the constraint file 340 or 350 to customize it based on desired pin locations. Exemplary partial compatibility includes having a compatible product but an incompatible device. Then device recommendations are outputted to the user. If there is an incompatible package, a warning message is printed indicating a serious difference in compatibility.

Illustrated in FIG. 4 is an partial listing an exemplary report file generated for a logic chip from one vendor and FIG. 5 is an exemplary constraints file for a compatible Xilinx device generated from the report file.

Illustrated in FIG. 6 is a message display to the user of exemplary device and package characteristics found from analyzing the report file of FIG. 4 with the present system. The device was identified as an Altera device. FIG. 6 also shows exemplary compatibility findings, e.g. compatible Xilinx devices. Other information is displayed to the user such as that the report file (identified as "count16.pin" is converted to a Xilinx user constraints file "count16.ucf". Below that message is an exemplary recommendation and information relating to what the conversion will do based on the degree of compatibility determined.

With the present invention, a circuit design created for a one logic device can be easily transferred to another compatible logic device supplied by a different vendor. Thus, a designer can easily re-target a design to different products without having to manually create new constraint files for a different device in accordance with the different vendor's requirements. Also, the designer can automatically identify compatible devices for a given device without having to research data books and specification sheets from many vendors and products.

While the present invention has been illustrated by the description of embodiments thereof, and while the embodiments have been described in considerable detail, it is not the intention of the applicants to restrict or in any way limit the scope of the appended claims to such detail. Additional advantages and modifications will readily appear to those skilled in the art. For example, the constraint file generator may be implemented as a servlet, an applet, a downloadable software application or other forms as known in the art. The constraint file generator may be part of the circuit design software as a function or module, or may be a separate program. Depending on the configuration, the report file 110 and circuit design 105 shown in FIG. 1 may be directly inputted to the constraints file generator 115. Therefore, the invention, in its broader aspects, is not limited to the specific details, the representative apparatus, and illustrative examples shown and described. Accordingly, departures may be made from such details without departing from the spirit or scope of the applicant's general inventive concept.

I claim:

1. A system for re-targeting a circuit design that was generated for a first programmable logic device to a second programmable logic device, the system comprising:
    compatibility logic for identifying a second programmable logic device that is compatible with the first programmable logic device; and
    a constraints file generator for receiving a report file configured for the first programmable logic device and translating the report file to a constraints file configured for the second programmable logic device such that the circuit design can be re-targeted on the second programmable logic device.

2. The system as set forth in claim 1 further including a parser for parsing the report file to determine identification information that identifies characteristics of the first programmable logic device.

3. The system as set forth in claim 2 wherein the identification information includes at least one of device type, product type, family type, package type, pinout data, and speed grade.

4. The system as set forth in claim 1 further including compatibility data that identifies compatibility characteristics between a plurality of programmable logic devices.

5. The system as set forth in claim 4 wherein the compatibility logic includes logic for matching characteristics of the first programmable logic device to the compatibility data to identify the second programmable logic device.

6. The system as set forth in claim 1 wherein the constraints file includes pinout constraints that allows the circuit design of the first programmable device to be targeted for the second programmable logic device.

7. The system as set forth in claim 1 wherein the report file includes a plurality of data files.

8. The system as set forth in claim 1 wherein the programmable logic device includes one of a complex programmable logic device, a field programmable logic device, a gate array, a cell based ASIC, and a custom designed integrated circuit.

9. The system as set forth in claim 1 wherein the system is embodied as computer executable instructions stored on a computer readable medium.

10. A process of translating a circuit design targeted for a first programmable logic device to be targeted to a second programmable logic device, the process comprising the steps of:
    receiving a report file that identifies characteristics of the circuit design relating to the first programmable logic device;
    identifying a second programmable logic device that is compatible with the first programmable device based on the characteristics from the report file; and generating a constraints file from the report file, the constraints file including pin constraints for the second programmable logic device that allows the circuit design to be targeted to the second programmable logic device.

11. The process as set forth in claim 10 further including parsing the report file to identify the characteristics of the first programmable logic device.

12. The process as set forth in claim 10 wherein the second programmable logic device is identified by matching the characteristics from the report file to pre-generated compatibility data that corresponds compatibility information between a plurality of programmable logic devices.

13. The process as set forth in claim 11 further including providing device recommendations based on the compatibility of the second programmable logic device.

14. The process as set forth in claim 10 wherein the identifying identifies one or more programmable logic devices that are compatible with the first programmable logic device.

15. The process as set forth in claim 14 wherein the identifying includes identifying one or more programmable logic devices that are partially compatible with the first programmable logic device.

16. The process as set forth in claim 10 wherein the first programmable logic device is a product from a first vendor and the second programmable logic device is a product from a second vendor, the process further including converting portions of the report file to comply with syntax of constraint files for the second vendor.

17. A computer executable software for performing the process of claim 10 including computer executable instructions.

18. A process of transferring a circuit design generated for a logic device to a compatible logic device, the process comprising the steps of:

analyzing a report file previously generated for the circuit design and the logic device where the report file includes characteristics of the logic device; and translating the report file into a constraints file in accordance with pin constraints of the compatible logic device, the constraints file allowing the circuit design to be transferred to the compatible logic device.

19. The process as set forth in claim 18 further including identifying the compatible logic device from compatibility data based on the characteristics of the logic device.

20. The process as set forth in claim 18 further including providing recommendations based on a degree of compatibility between the logic device and the compatible logic device.

21. The process as set forth in claim 18 wherein the characteristics include signal locations of the circuit design corresponding to the logic device.

22. The process as set forth in claim 18 wherein the translating includes translating the report file being in a first format used by a first vendor to the constraints file being in a second format used by a second vendor.

23. A computer executable software including computer executable instructions for performing the process of claim 18.

* * * * *